(12) United States Patent
Lee et al.

(10) Patent No.: US 9,293,173 B2
(45) Date of Patent: *Mar. 22, 2016

(54) NON-VOLATILE MEMORY AND METHOD WITH PEAK CURRENT CONTROL

(71) Applicant: SanDisk Technologies Inc., Plano, TX (US)

(72) Inventors: Dana Lee, Saratoga, CA (US); Yi-Chieh Chen, San Jose, CA (US); Farookh Moogat, Fremont, CA (US)

(73) Assignee: SanDisk Technologies Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/507,647

(22) Filed: Oct. 6, 2014

(65) Prior Publication Data

US 2015/0023116 A1  Jan. 22, 2015

Related U.S. Application Data

(63) Continuation of application No. 13/559,377, filed on Jul. 26, 2012, now Pat. No. 8,854,900.

(51) Int. Cl.
*G11C 7/00* (2006.01)
*G11C 5/14* (2006.01)
*G11C 16/30* (2006.01)

(52) U.S. Cl.
CPC . *G11C 5/14* (2013.01); *G11C 16/30* (2013.01)

(58) Field of Classification Search
CPC ............. G11C 8/08; G11C 7/12; G11C 5/145
USPC ................................ 365/189.11, 226, 189.18
See application file for complete search history.

(56) References Cited

U.S. PATENT DOCUMENTS 5,070,032 A   12/1991   Yuan et al.
5,095,344 A    3/1992   Harari et al.
(Continued)

FOREIGN PATENT DOCUMENTS

WO   WO 2012/015793   2/2012

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Son Dinh
(74) *Attorney, Agent, or Firm* — Sterne, Kessler, Goldstein & Fox PLLC

(57) ABSTRACT

A non-volatile memory with multiple memory dice manages simultaneous operations so as to not exceed a system power capacity. A load signal bus is pulled up with a strength proportional to the system power capacity. Each die has a driver to pull down the bus by an amount corresponding to its degree of power need as estimated by a state machine of the die. The bus therefore provides a load signal that serves as arbitration between the system power capacity and the cumulative loads of the individual dice. The load signal is therefore at a high state when the system power capacity is not exceeded; otherwise it is at a low state. When a die wishes to perform an operation and requests a certain amount of power, it drives the bus accordingly and its state machine either proceeds with the operation or not, depending on the load signal.

20 Claims, 9 Drawing Sheets

(56) References Cited

U.S. PATENT DOCUMENTS

| | | | |
|---|---|---|---|
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |
| 5,661,053 | A | 8/1997 | Yuan |
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 7,558,130 | B2 * | 7/2009 | Grunzke ............ 365/191 |
| 7,656,711 | B2 | 2/2010 | Shibata et al. |
| 7,701,764 | B2 | 4/2010 | Nguyen |
| 7,925,910 | B2 | 4/2011 | Lee |
| 8,854,900 | B2 * | 10/2014 | Lee et al. ............ 365/189.11 |
| 2010/0172180 | A1 | 7/2010 | Paley et al. |

OTHER PUBLICATIONS

Notification of Transmittal of the International Search Report and the Written Opinion of the International Searching Authority, or the Declaration, mailed on Oct. 28, 2013, 9 pages.

* cited by examiner

*(Prior Art)* *FIG. 2*

NON-VOLATILE MEMORY AND METHOD WITH PEAK CURRENT CONTROL

This application is a continuation of U.S. patent application Ser. No. 13/559,377 filed Jul. 26, 2012, now U.S. Pat. No. 8,854,900.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. More recently, flash memory in the form of solid-state disks ("SSD") is beginning to replace hard disks in portable computers as well as in fixed location installations. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card or SSD are ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Current commercial products configure each storage element of a flash EEPROM array to store either a single bit of data or more than a single bit of data. A single-level-cell (SLC) memory has each cell storing a single bit of data by operating in a binary mode, where a single reference level differentiates between two ranges of threshold levels of each storage element.

The threshold levels of transistors correspond to ranges of charge levels stored on their storage elements. In addition to shrinking the size of the memory arrays, the trend is to further increase the density of data storage of such memory arrays by storing more than one bit of data in each storage element transistor. A multi-level-cell (MLC) memory has each cell storing more a single bit of data by operating in a multi-level mode, where two or more reference levels differentiates between more than two ranges of threshold levels of each storage element. For example, commercial flash memory products now operate in four states (2 bits of data per storage element) or eight states (3 bits of data per storage element) or 16 states per storage element (4 bits of data per storage element). Each storage element memory transistor has a certain total range (window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. More recently, the memory devices in the form of SSD are being offered commercially in the form factor of a standard hard drive.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Multi-Chip Operating Environment

High performance integrated-circuit memory devices can have multiple dice or chips all drawing from the same power supply. Each dice may contain a memory array with peripheral circuits. At any one time, many of these multiple dice may be involved in various memory operations. Thus the supply current ("ICC") are liable to have large spikes due to these internal operations. In a multi-die operation, these ICC loads sum together. These spikes may align and violate the total package ICC allowance for peak current.

Conventionally, various solutions have been offered.

U.S. Pat. No. 7,701,764 discloses limiting the number of simultaneous operating chips. These spikes are predictable to some extend since they correlate with operations that are determined by the internal state-machine (e.g. pre-charging the bit-lines prior to programming). When a global memory command is received at each chip concurrently, it is initiated at different times for at least two of the chips to mitigate peak power consumption.

U.S. Pat. No. 7,925,910 discloses a method to limit peak power consumption of a multi-chip device on power-up. Each chip has a power-up circuit that imposes a different ramp-up rate. In this way, the current being drawn by each chip may be individually controlled to ensure that each individual device does not reach peak current consumption, or that the chips do not draw the same amount of current at the same time.

U.S. Pat. No. 7,656,711 discloses a communication line among the multiple chips and the controller is used to indicate if one chip is in the peak current mode. When the communication line is pulled by one chip to indicate that it is in a peak current operation, other chips are kept in the wait state. Multiple communication lines can be used to indicate different magnitude of peak current operations. This method cannot detect the sum-up of smaller current and only one chip can be doing the peak current operation at a time. Also, more than one pin is required if granting more than one chip to engage in peak current operations of different magnitude. The controller controls each chip so that the generation timing of the peak current on each chip is not overlapped.

Thus, the various solutions are to have the start times of the individual operations of each die staggered (skewed). This can prevent alignment of peak current at the beginning of any sequence. However, for long operation sequences which have internally timed state-machines, the die may start to un-skew and re-align.

In yet another solution, the programming operation has step-by-step start/stop control ("Peak Current Control"). This allows for an external controller to have fine-grained control over start of individual phases of the programming algorithm so as to maintain the skew over the long run. This puts extra control burden on an external controller.

Thus, there is a need to provide a nonvolatile memory that can efficiently allow multiple dice or chips to operate in parallel without exceeding the power capacity of the memory.

SUMMARY OF THE INVENTION

According to one aspect of the invention, a non-volatile memory with multiple memory dice manages the degree of simultaneous operations so as to not exceed a system power capacity. A load signal bus is pulled up with a strength proportional to the system power capacity. Each die has a driver to pull down the common bus by an amount corresponding to its degree of power need as estimated by a state machine of the die. The bus therefore provides a load signal that serves as arbitration between the system power capacity and the cumulative loads of the individual dice. The load signal is in a first voltage range (e.g., a HIGH state) when the system power capacity is not exceeded; otherwise it is in a second voltage range (e.g., a LOW state). When a die wishes to perform an operation and requests a certain amount of power, it drives the bus accordingly and its state machine either proceeds with the operation or not, depending on the load signal.

Thus, the invention involves two features. First, an asynchronous input/output signal is provided for each die. Each die will output a signal that indicates it is current drawing or intend to request a system resource such as ICC ("current from the system power supply"). Furthermore, each die will input a signal saying whether the system can satisfy such a resource demand. Secondly, a multi-die, system-level connection in which the cumulative demand information of the active dice are summed. This summed result can be sensed by each die.

In one embodiment, the load signal bus is pulled up by a set of one or more pull-up drivers. If there is only one pull-up driver, the common pull-up driver can be placed on one specific die, or on the memory controller.

When there are more than one pull-up drivers, they are distributed among the individual dice. In a preferred embodiment, the set of one or more pull-up drivers includes one local pull-up driver at each die.

In a preferred embodiment, the load signal bus is not driven until an arbitration is required, such as a new die requesting power. Power to operate the bus is reduced when operating in a transitory manner.

In one embodiment, the pull-up and pull down drivers are implemented by current sources and current sinks respectively, which, for example, are approximated by resistors.

In yet another embodiment, when the load signal is at the second voltage range to indicate that the predetermined power capacity has been exceeded after two local dice are simultaneously requesting power, the state machines of the two dies have the two dice repeating the request at different times.

In yet another embodiment, the power arbitration scheme is also applicable to other sources of power consumption by the die, which information is not readily available from the state machine but from the memory controller. In that case, the controller is used to estimate the needed power instead of the state machine in a die.

In general, the multiple dice power management does not require the involvement of a memory controller. Only one pin is required for each die to interact with the load signal bus. In this way, a memory device can manage the budget of the power needed for parallel operations among its multiple dice without an external controller.

Additional features and advantages of the present invention will be understood from the following description of its preferred embodiments, which description should be taken in conjunction with the accompanying drawings.

DETAILED DESCRIPTION OF THE PREFERRED EMBODIMENTS

Memory System

Figure 1:
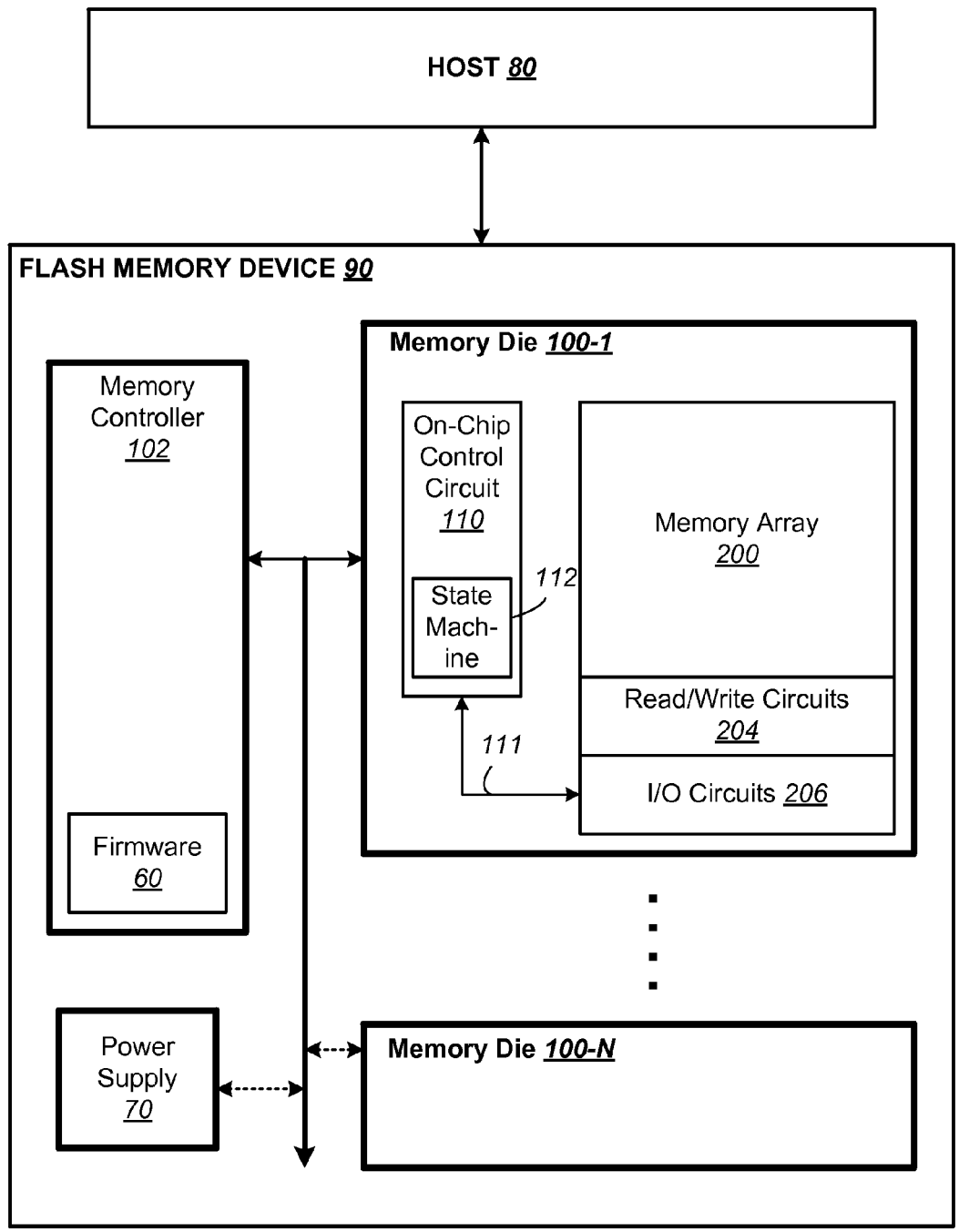
FIG. 1 illustrates a host in communication with a memory device in which the features of the present invention are embodied.

FIG. 1 illustrates a host in communication with a memory device in which the features of the present invention are embodied. The host 80 typically sends data to be stored at the memory device 90 or retrieves data by reading the memory device 90. The memory device 90 includes one or more memory die or chip 100 managed by a memory controller 102. The memory controller 102 is typically implemented as another chip. FIG. 1 shows, for example, the memory device having N die, such as memory die 100-1, . . . , memory die 100-N. The memory device 90 is powered by a power supply 70 that has a predetermined maximum capacity. A memory device bus 91 provides communications and power between the memory controller 102, the power supply 70 and the one or more memory die 100.

The memory die 100 includes a memory array 200 of memory cells with each cell capable of being configured as a multi-level cell ("MLC") for storing multiple bits of data, as well as capable of being configured as a single-level cell ("SLC") for storing 1 bit of data. The memory die also includes peripheral circuits such as row and column decoders (not shown), read/write circuits 204 and I/O circuits 206. An on-chip control circuitry 110 controls low-level memory operations of each die. The control circuitry 110 is an on-chip controller that cooperates with the peripheral circuits to perform memory operations on the memory array 200. The control circuitry 110 includes a state machine 112 to provide die or chip level control of low-level memory operations via an internal bus 111 for carrying control signals, data and addresses.

In many implementations, the host 80 communicates and interacts with the memory chip 100 via the memory controller 102. The controller 102 co-operates with the memory chip and controls and manages higher level memory operations. A firmware 60 provides codes to implement the functions of the controller 102.

For example, in a host write, the host 10 sends data to be written to the memory array 100 in logical sectors allocated from a file system of the host's operating system. A memory block management system implemented in the controller stages the sectors and maps and stores them to the physical structure of the memory array. A preferred block management system is disclosed in United States Patent Application Publication Number: US-2010-0172180-A1, the entire disclosure of which is incorporated herein by reference.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

Figure 2:
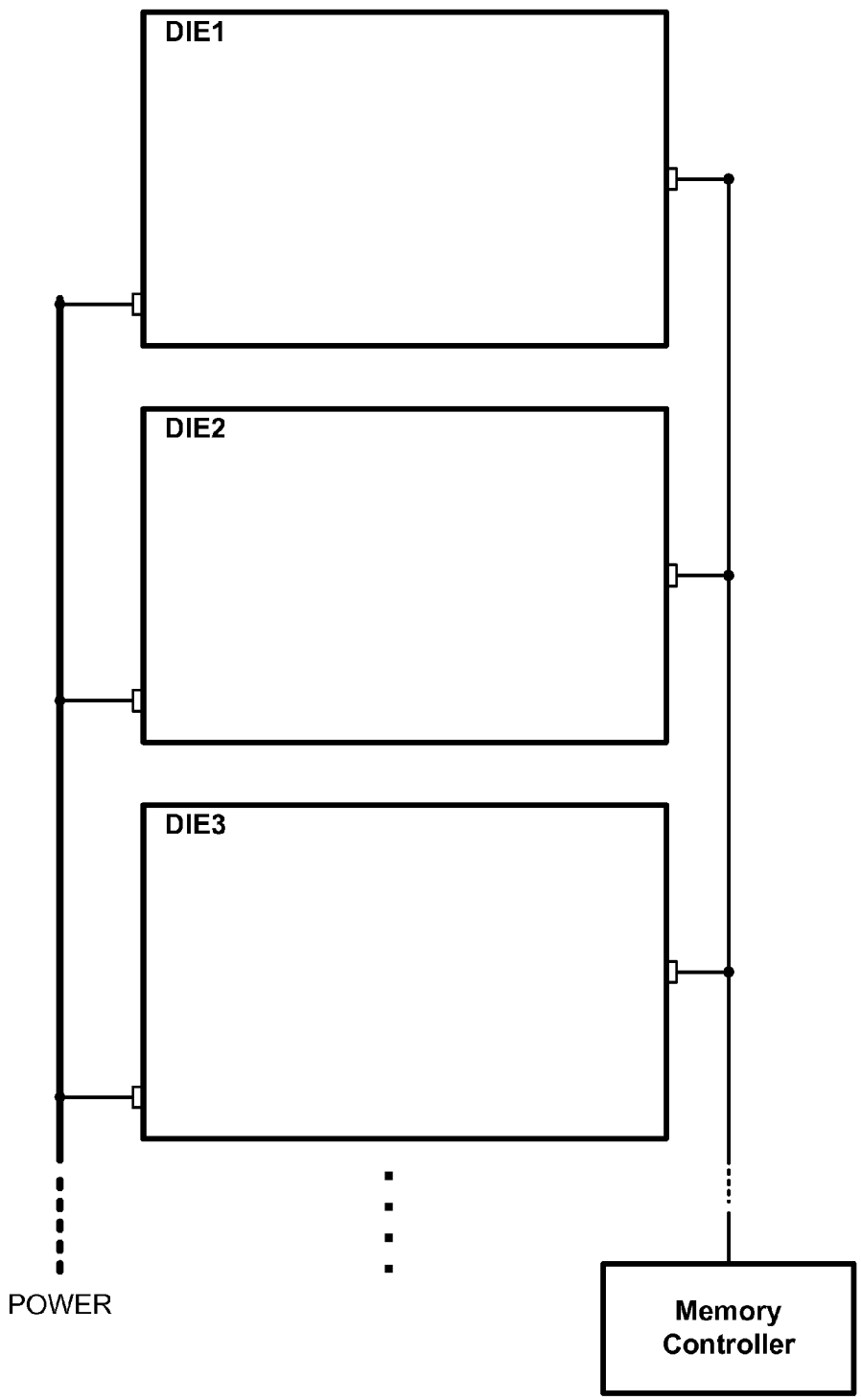
FIG. 2 illustrates a conventional scheme in which power consumption of multiple dice is managed by the memory controller.

FIG. 2 illustrates a conventional scheme in which the power consumption of multiple dice is managed by the memory controller. As explained in an earlier section, this controller-managed scheme is disadvantageous because it puts extra control burden on an external controller and may involve multiple communication lines between the dice and the memory controller.

According to a general embodiment of the invention, each die has a common signal pin with a programmable current source. A die which wants to request a resource such as ICC will apply a pull-down current proportionally scaled to the magnitude of the request on this signal pin. The pins of multiple die in a multi-die package are connected in parallel. Thus the sum of the demand signals will appear on the common signal. This signal can be compared vs. a pull-up current. If the pull-up exceeds the pull-down demand, the signal will go high and each die can detect this as a "go-ahead" signal. If the pull-down demand exceeds the pull-up the common signal will go low and a die which has a pending request for demand will go into a wait state.

Figure 3:
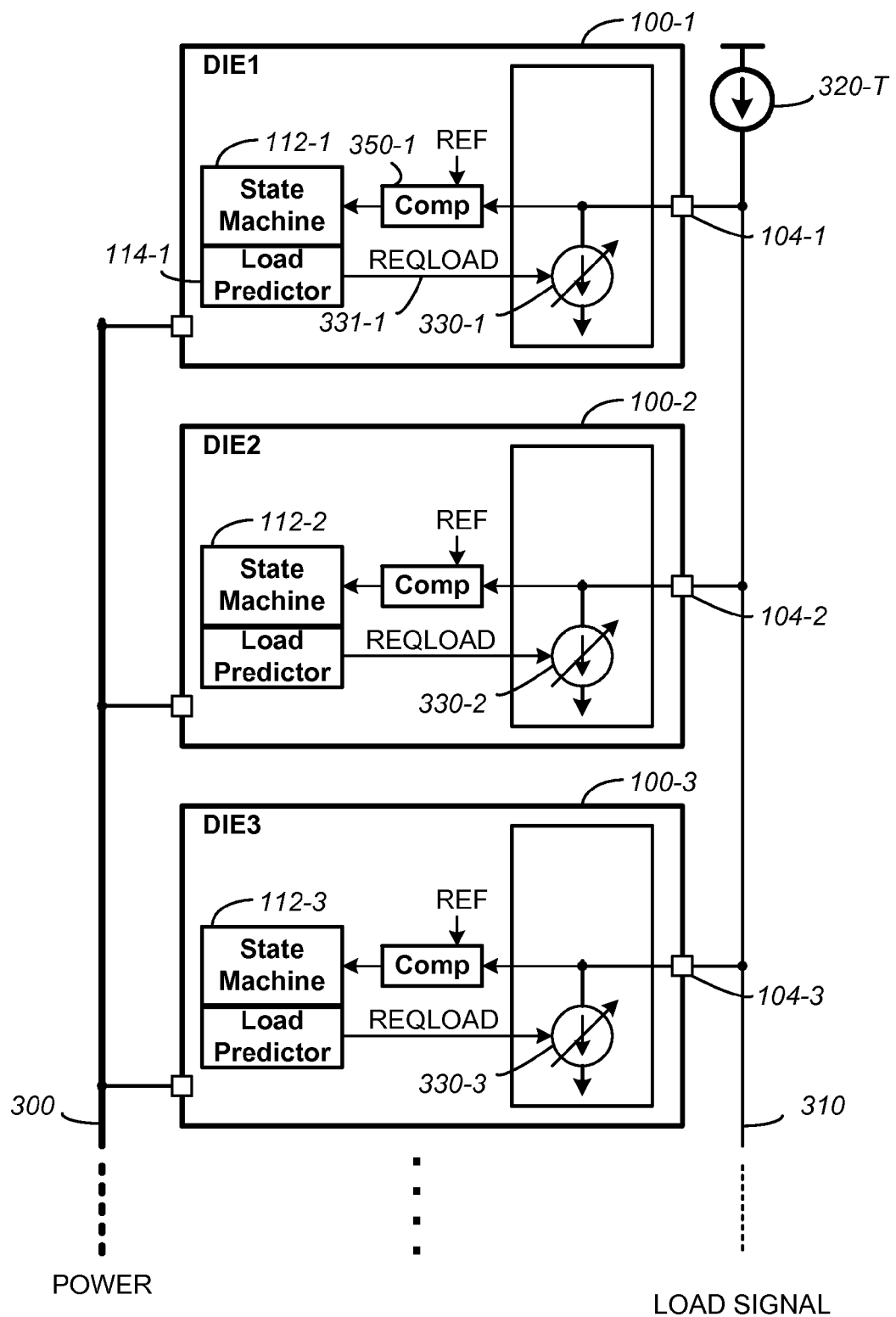
FIG. 3 illustrates one implementation of a power management system among multiple dice of a memory device.

FIG. 3 illustrates one implementation of a power management system among multiple dice of a memory device. The memory device 90 shown in FIG. 1 contains multiple dice 100, such as DIE 1 100-1, DIE 2 100-2, DIE 3 100-3, . . . . The multiple dice are powered by a common power bus 300 which has a predetermined power capacity.

The power management system employs a load bus 310 which carries a LOAD SIGNAL to indicate if the predetermined power capacity on the power bus 300 is exceeded or not as individual dice make power requests on the power bus 300. The load signal bus 310 is pulled up by a pull-up driver 320-T, which may be conveniently located within the memory device 90 or the memory controller 102 (see FIG. 1). The pull-up driver 320-T is programmable and has a pull-up strength proportional to the predetermined power capacity and thus provides a measure of the predetermined power capacity.

The load signal bus 310 is also being pulled down by individual pull-down drivers such as 330-1, 330-2, 330-3, . . . among the dice. When a die, such as die 1, receives a command to perform a memory operation, the state machine 112-1 is responsible for sequencing and executing the memory operation. The state machine determines the current and future operations. The die needs to forecast the "worst" case current to be used for a given time period. So the finer-grained the state-machine operations, the more efficiently the request can be made. Even after a time period has started, the forecast for the remaining period could go up and down to reflect forecast for the remainder of the period. However, it is preferable to not have each die interrupt any "atomic" state-machine operation that has already started. Preferably the forecast should only be allowed to go down (e.g. once the spike period has subsided).

The state machine 112-1 will make a request for power required to perform the memory operation. This is accomplished by a load predictor 114-1, which is preferably implemented as a lookup table of power loads required to operate various memory operations depending on current and future states, will be informed by the state machine as to what type of memory operation is being requested.

The load-predictor uses the information supplied by the state machine to predict the power load required. The load predictor 114-1 will then output a drive signal REQLOAD in a line 331-1 to the pull-down driver 330-1 such that the pull-down strength of the pull-down driver 330-1 on the load signal bus 300 is proportional to the power load predicted for the requested memory operation on die 1.

The load signal bus 310 has a pull-up strength representative of the total power capacity of the system. It will initially be pulled up by the pull-up driver 320-T to Vcc, thereby rendering the LOAD SIGNAL to be at a logical HIGH state. As more and more individual dice are making power request, the power bus 300 is increasingly being pulled by the individual pull-down drivers 330 towards ground. If a latest request results in a cumulative pull-down strength that exceeds the total pull-up strength, then the power bus will be pulled towards ground, resulting in the LOAD SIGNAL being at a LOW state. When the LOAD SIGNAL is LOW, it means that the total capacity of the system power is exceeded and the latest power request cannot be serviced.

Each die, such as die 1, when making a power request, also senses the LOAD SIGNAL from the load signal bus 310. A comparator 350-1 compares the LOAD SIGNAL relative to a reference voltage REF. It basically converts the analog form of the LOAD SIGNAL to a binary form of either HIGH or LOW for feeding to the state machine 112-1. For example, when the analog form of the LOAD SIGNAL is in a first voltage range above the reference voltage REF, the binary form of the LOAD SIGNAL is at a HIGH state. When the analog form of the LOAD SIGNAL is in a second voltage range below the reference voltage REF, the binary form of the LOAD SIGNAL is at a LOW state. If the LOAD SIGNAL is HIGH, it means the power capacity has not been exceeded and the state machine can proceed with the memory operation. On the other hand, if the LOAD SIGNAL is LOW, it means the power capacity has been exceeded and the state machine will postpone the load-driving memory operation until a subsequent request was successful when the power bus 300 has sufficient capacity.

The power management system is being implemented without the need for an external memory controller. As can be seen from FIG. 3, each die only requires a single pin 104 (104-1 for Die 1) to interact with the load signal bus 310. In practice, the pin could be shared with other functions which are not simultaneously used. For example, command sequence or parameter will allow the pin to toggle purpose between the dual usages.

Figure 4:
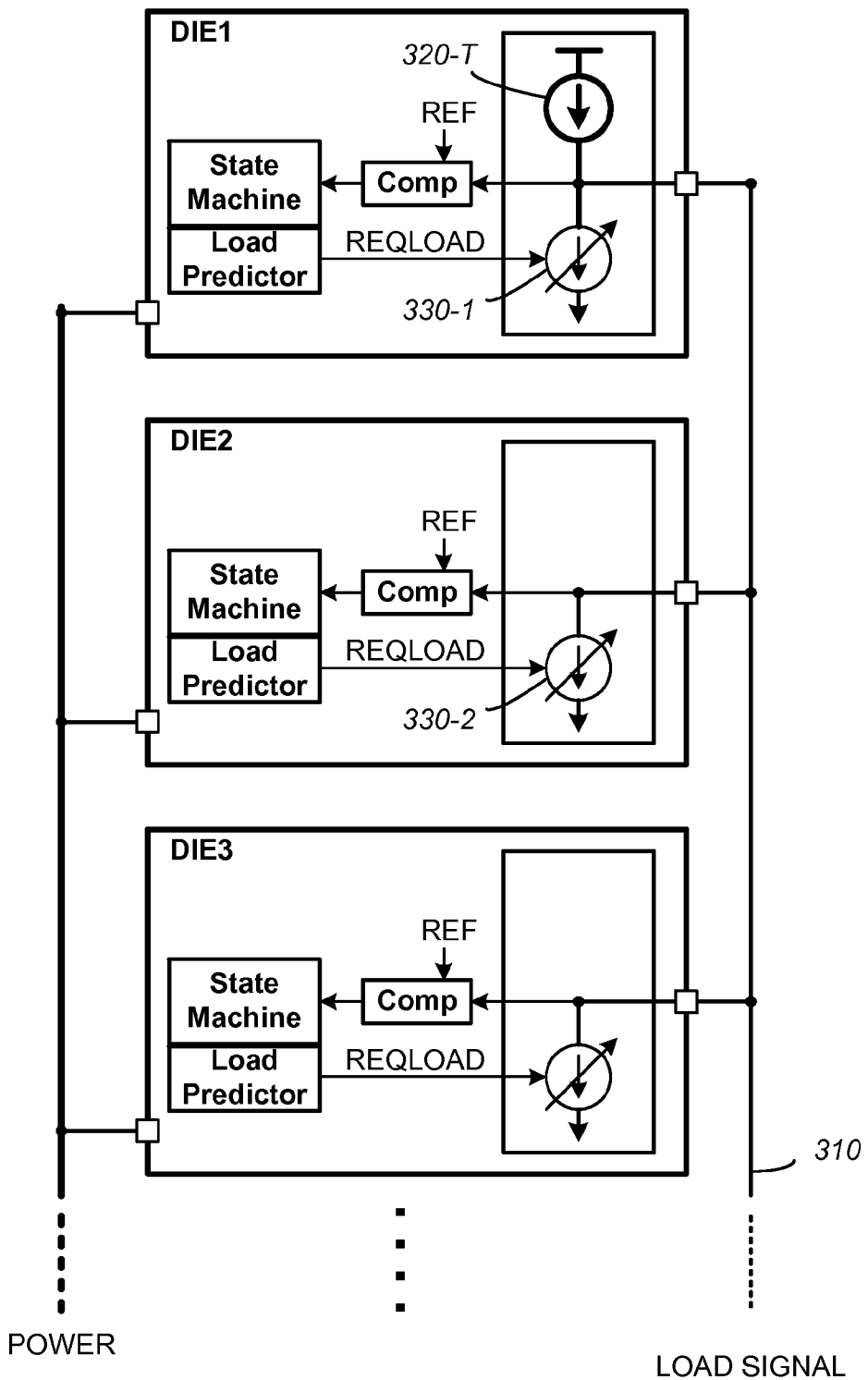
FIG. 4 illustrates another implementation of the pull-up driver of FIG. 3 being located in one of the dice.

FIG. 4 illustrates another implementation of the pull-up driver of FIG. 3 being located in one of the dice. For example, the pull-up driver 320-T is located in die 1. The programmable pull-up can be supplied by the controller or can be supplied internally by one or more of the NAND die.

Figure 5:
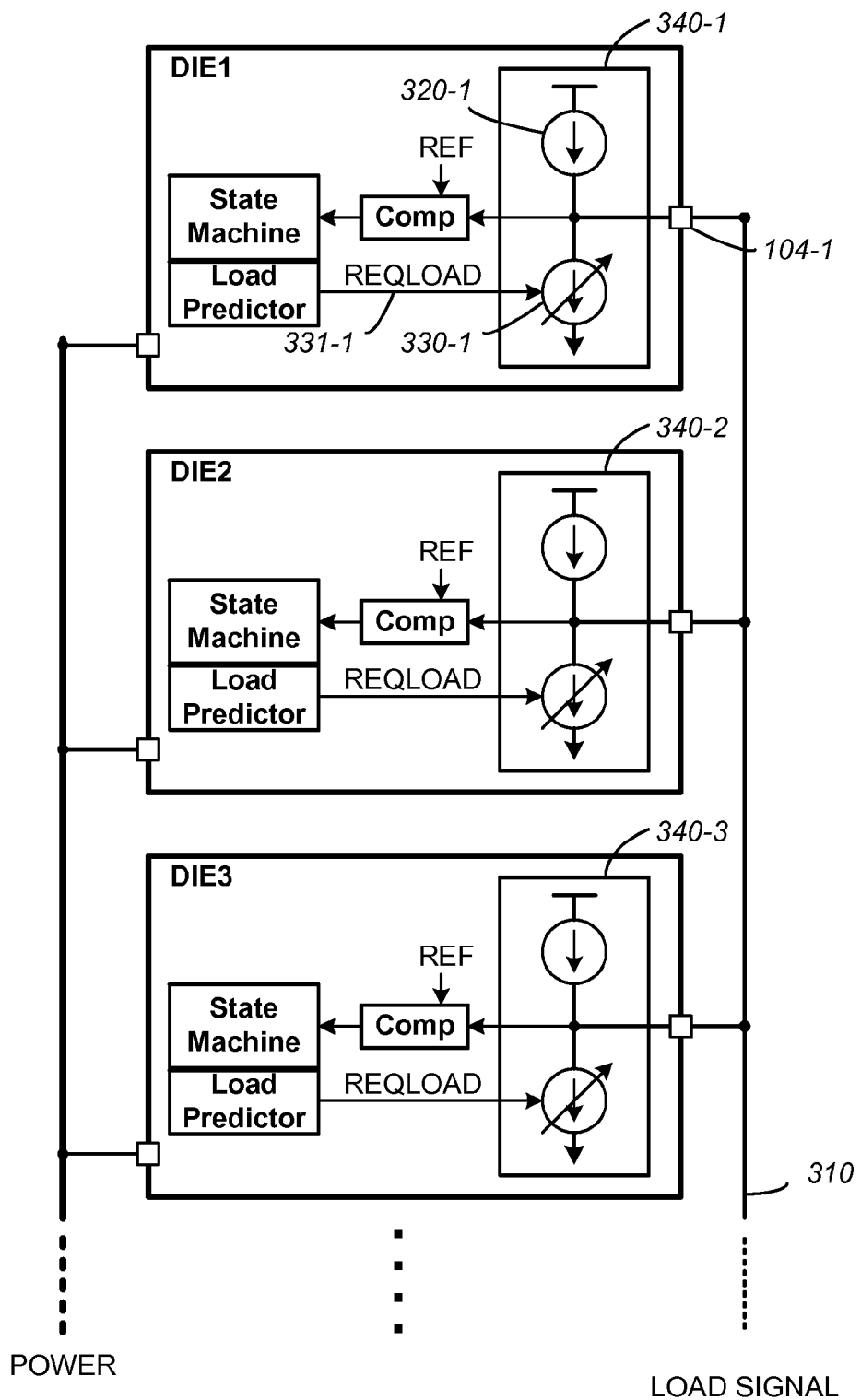
FIG. 5 illustrates yet another implementation of the pull-up driver of FIG. 3 being distributed among the dice.

FIG. 5 illustrates yet another implementation of the pull-up driver of FIG. 3 being distributed among the dice. The pull-up driver 320-T is distributed in each of the dice so that the pull-up effects of the pull-up drivers 320-1 in die 1, 320-2 in die 2, 320-3 in die 3, . . . add up to the pull-up effect of the pull-up driver 320-T shown in FIG. 3 or FIG. 4.

Figure 6:
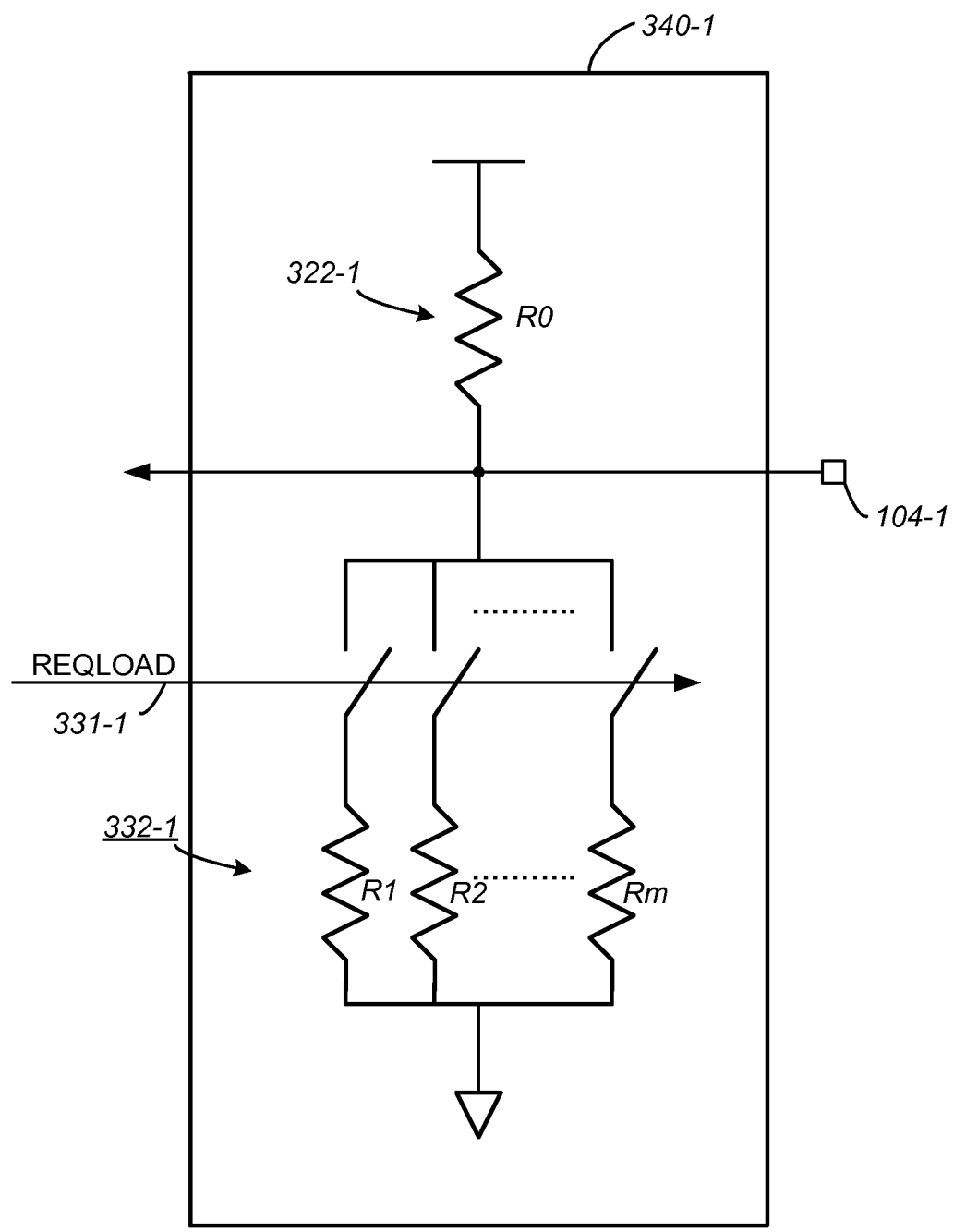
FIG. 6 illustrates a simple implementation of the pull-up or pull-down drivers.

FIG. 6 illustrates a simple implementation of the pull-up or pull-down drivers. The pull-up drivers such as 320-T or 320-1, 320-2, . . . and the pull-down drivers such as 330-1, 330-2, . . . can be implemented as current sources or sinks For example in FIG. 5, die 1 has a pair 340-1 of pull-up driver 320-1 and pull-down driver 330-1 to act on the load signal bus 310 via the pin 104-1. A simple implementation of the pull-up and pull-down pair 340-1 is to use load resistors to approximate and replace the current source and sink. In such a case, the die may have to calculate a correction to account for number of dice in system. Thus, the pull-up driver is approximated by a resistor R0 322-1 across the pin 104-1 and Vcc. The pull-down driver is approximated by a bank of switchable resistors R1, R2, R3, . . . 332-1 across the pin 104-1 and ground. Depending of the value of the signal REQLOAD, an appropriate one of the bank of resistor 332-1 is selected.

As described earlier, when a die has a scheduled memory operation, its state machine 112 in conjunction with a load predicator 114 estimates the power required and submit a request for the estimated power to the load signal bus 310. If the load signal bus is pulled down to the LOW state, the request is denied and the state machine refrains from starting the requested operation so as not to exceed the maximum capacitor of the power bus 300.

If two or more die's simultaneously request a load then they may reach a deadlock situation. Deadlock avoidance techniques can include having each die waiting a different amount of time before re-submitting the request. Longer wait times lead to a "lower priority" request since it allows some other die to grab the resource. In one embodiment, the waiting time is deterministic (e.g. based on some unique characteristic like a serial identification of that die). In another embodiment, the waiting time is pseudo-random. In yet another embodiment, the waiting time is a function of magnitude of load request as well as total incurred delay ("impatience factor").

Figure 7:
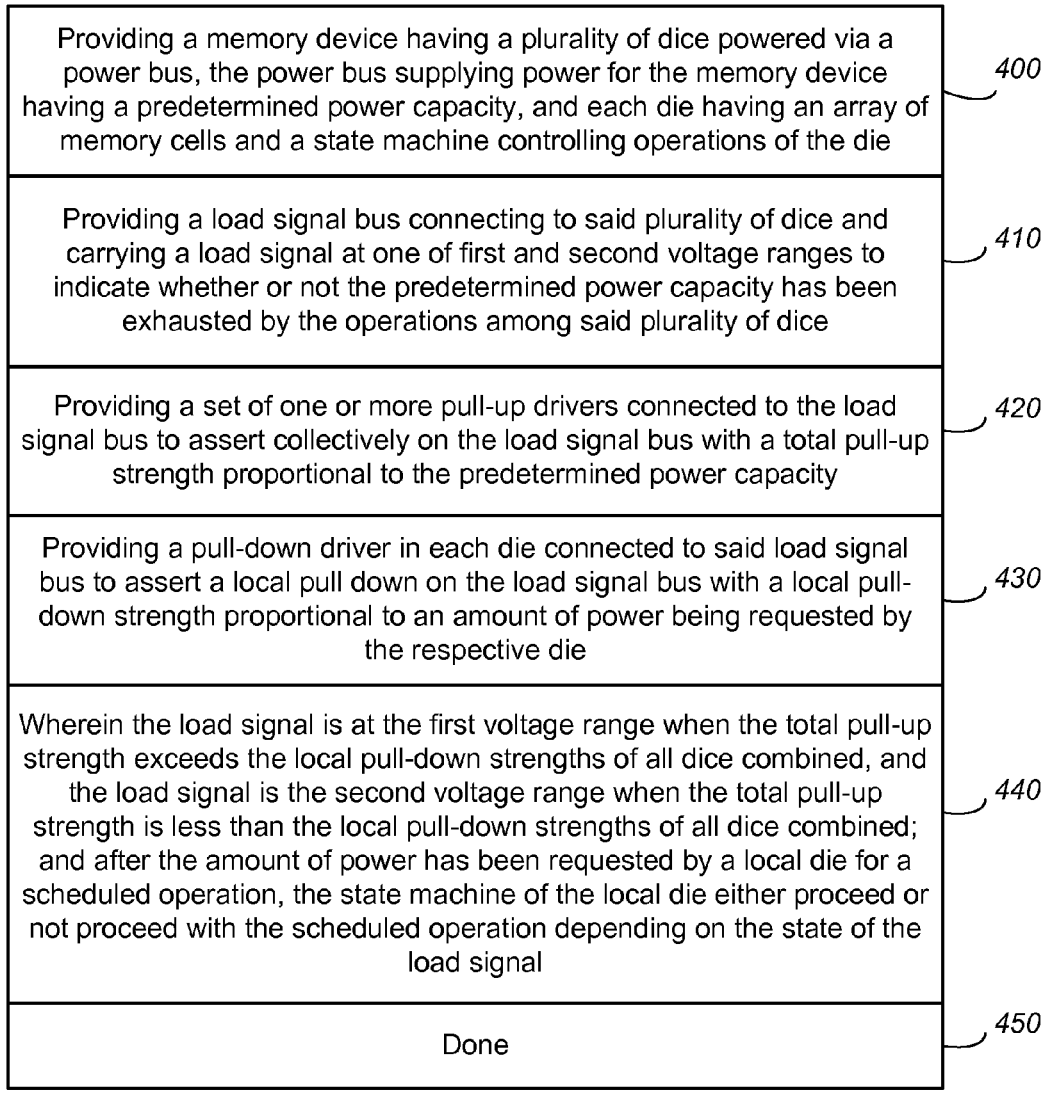
FIG. 7 is a flow diagram illustrating the power arbitration scheme among multiple dice of a memory device.

FIG. 7 is a flow diagram illustrating the power arbitration scheme among multiple dice of a memory device.

STEP 400: Providing a memory device having a plurality of dice powered via a power bus, the power bus supplying power for the memory device having a predetermined power capacity, and each die having an array of memory cells and a state machine controlling operations of the die.

STEP 410: Providing a load signal bus connecting to said plurality of dice and carrying a load signal at one of first and second voltage ranges to indicate whether or not the predetermined power capacity has been exhausted by the operations among said plurality of dice.

STEP 420: Providing a set of one or more pull-up drivers connected to the load signal bus to assert collectively on the load signal bus with a total pull-up strength proportional to the predetermined power capacity.

STEP 430: Providing a pull-down driver in each die connected to said load signal bus to assert a local pull down on the load signal bus with a local pull-down strength proportional to an amount of power being requested by the respective die.

STEP 440: wherein the load signal is at the first voltage range when the total pull-up strength exceeds the local pull-down strengths of all dice combined, and the load signal is the second voltage range when the total pull-up strength is less than the local pull-down strengths of all dice combined; and after the amount of power has been requested by a local die for a scheduled operation, the state machine of the local die either proceed or not proceed with the scheduled operation depending on the state of the load signal.

STEP 450: Done.

In yet another embodiment, the power arbitration scheme is also applicable to other components of the memory device that need to make demand on the system power. This information may not be available from a state machine on a die but can be supplied by the memory controller. For example, the state machine on a die does not control the I/O operations between the die and the memory controller and I/O operations also consume power. So the controller is used instead of the state machine of a die to provide estimates of power needs and to sense the LOAD SIGNAL to determine whether there is sufficient supply current allowance available.

Figure 8:
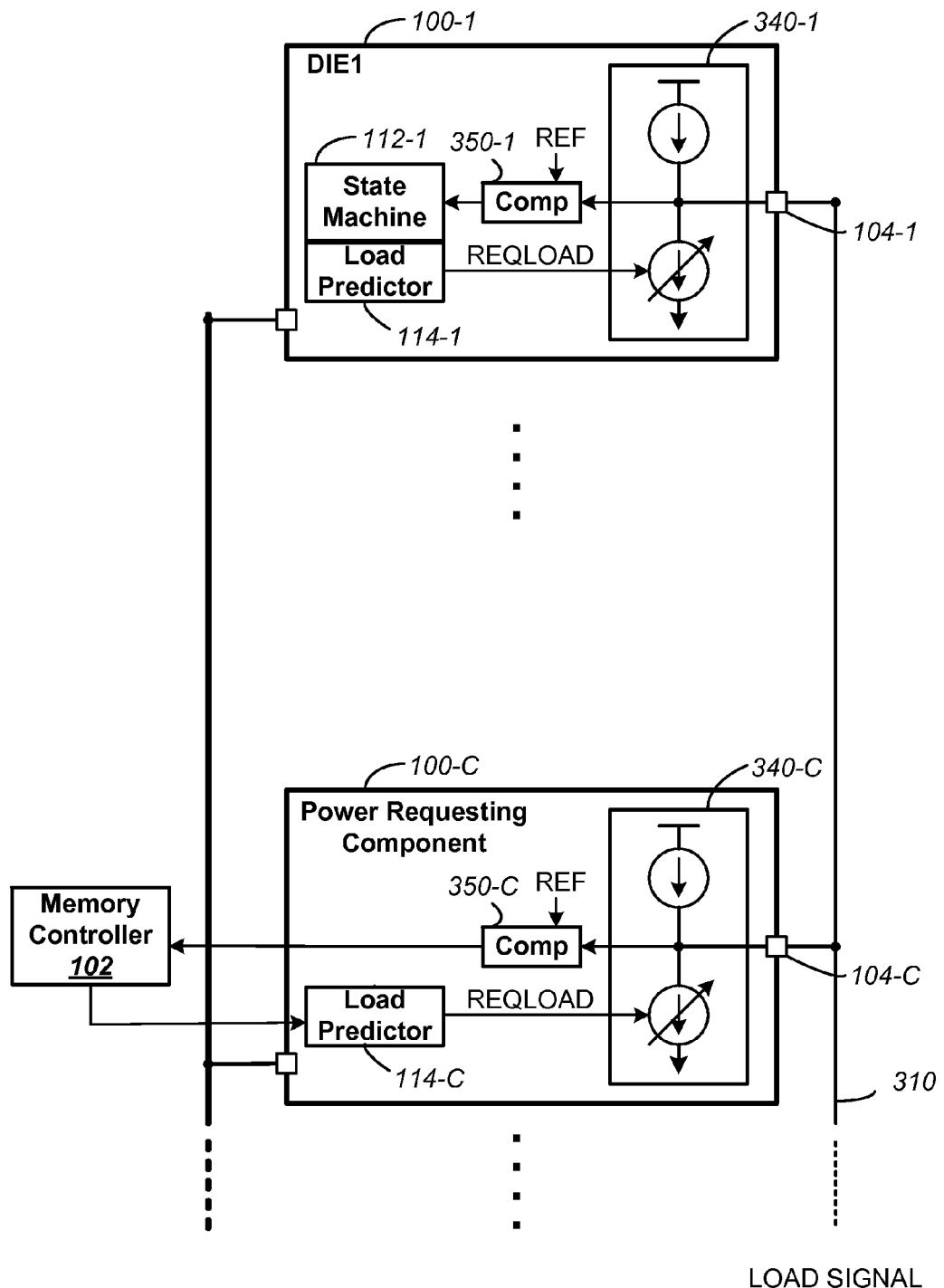
FIG. 8 illustrates another component of the memory device participating in the multiple die power sharing scheme.

FIG. 8 illustrates another component of the memory device participating in the multiple die power sharing scheme. Similar to the power arbitration scheme shown in FIGS. 3-5, a component 100-C of the memory device is treated like another die when requesting power. Thus, it has its own pull-up/pull-down drivers 340-C, comparator 350-C and load predictor 114-C. However, the state machine is being replaced by the memory controller 102. In similar fashion, the memory controller will provide information about a power request for an operation to the load predictor 114-C which will pull down the load signal bus 310 by an amount proportional to the amount of predicted power being requested. The load signal will be sensed via the comparator 350-C to inform the controller 102 whether to proceed with the operation or not.

As a further refinement, activating the pull-up and pull-down drivers is only necessary when a sensing of LOAD SIGNAL during a power request by a die. At other times, they are preferably deactivated to save power. Thus the pull-up drivers can be operated or strobed in a transitory manner so as to only draw current when a sense operation is needed.

Figure 9:
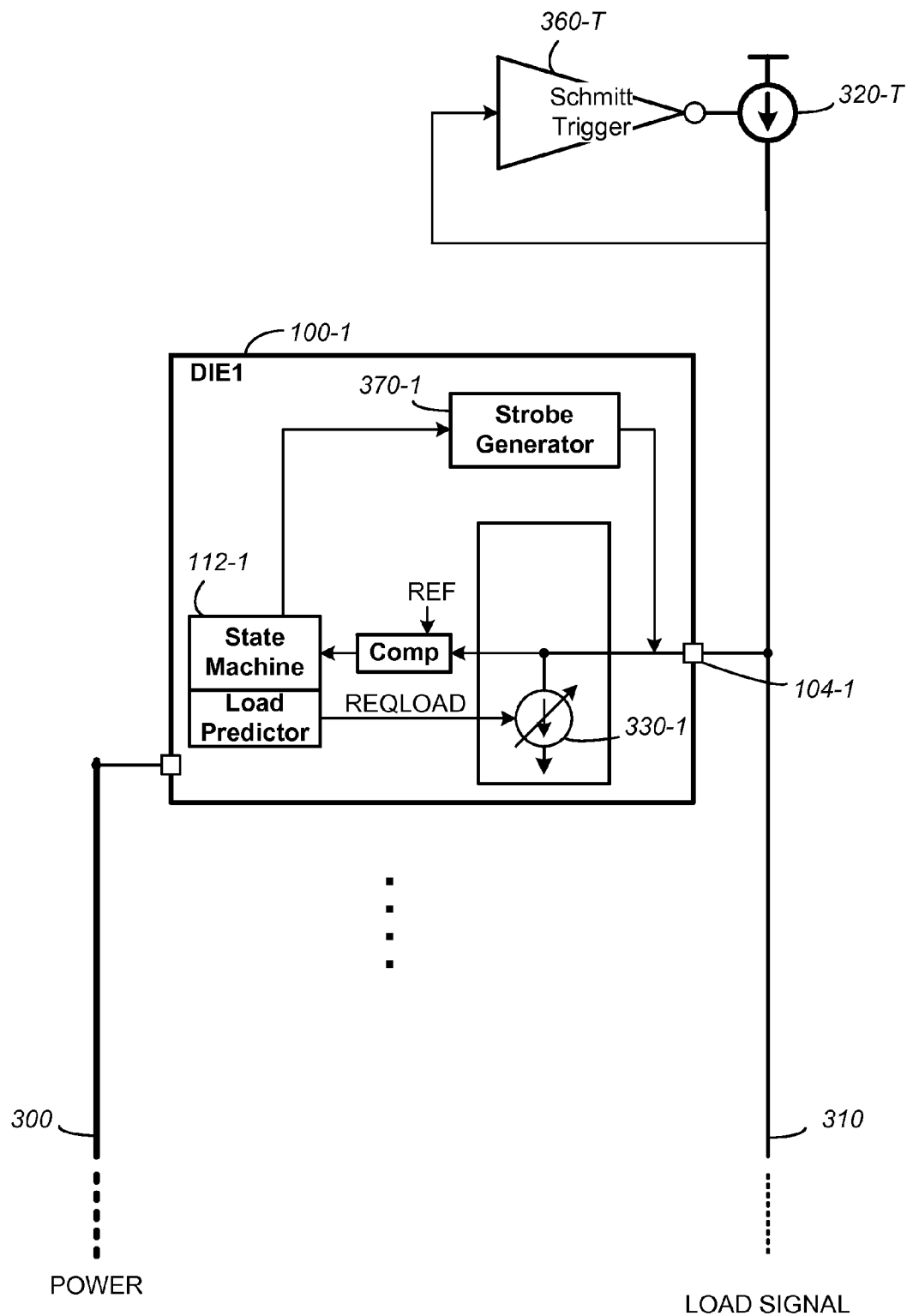
FIG. 9 illustrates a power-saving modification to the power arbitration scheme of FIG. 3 or 4.

FIG. 9 illustrates a power-saving modification to the power arbitration scheme of FIG. 3 or 4. To shut off DC current when not needed a latch is preferably added to the pull-up. In this example, the latch is effected by a Schmitt trigger 360-T. When a die, such as die 1 wants to check for current loading it forces a logic high at the pin 104-1. This is accomplished by a strobe generator 370-1 triggered by the state machine 112-1. This will activate the pull-up driver 320-T via the Schmitt trigger 360-T. Then the strobe signal goes into high-Z so that the pin can resolve to high or low value depending on whether the predicted load is allowed or blocked respectively. Once the die determines the state of the signal, then it forces a logic-low at the strobe pin. This will de-activate the pull-up driver 320-T and the signal at the pin 104-1 will drop to low level with no DC current path in the circuit of each die formed by the pull-up driver 320-T and the pull-down driver 330-1.

In this case, the pull-up current is initiated locally by each die. It is only strobed momentarily during a "request". When not requesting, the strobe is off and no DC current flows. If the LOAD SIGNAL is LOW then the die goes into a wait-state. If the pull-up succeeds, then the requested operation is allowed. To prevent simultaneous strobing. Each die is strobed twice with unique interval between strobes. If the die sees a signal coming at an interval not matching its own then it knows it was generated off-die and will go into wait-state. The die with the smallest interval will be selected over the other one.

The latched pull-up described with respect to FIG. 9 is conveniently applied to the embodiment of FIGS. 3 and 4 where there is a single pull-up driver 320-T. The latch and pull-up driver 320-T can be located in the memory controller chip. The latched pull-up scheme can equally be applied to the embodiment with distributed pull-up driver shown in FIG. 5. In this case, each pull-up driver 320-1, 320-2, . . . , will be driven by a respective Schmitt trigger.

Although the various aspects of the present invention have been described with respect to certain embodiments, it is understood that the invention is entitled to protection within the full scope of the appended claims.

It is claimed:
1. A memory device, comprising:
a plurality of dice powered via a power bus, the power bus supplying power for the memory device having a predetermined power capacity,
each die having an array of memory cells;
a load signal bus connecting to said plurality of dice and carrying a load signal at one of first and second voltage ranges to indicate whether or not the predetermined power capacity has been exhausted by operations among said plurality of dice;
said load signal bus having a set of one or more pull-up drivers with a total pull-up strength proportional to the predetermined power capacity; and
a pull-down driver in each die connected to said load signal bus to assert a local pull-down on the load signal bus with a local pull-down strength proportional to an amount of power being requested by the respective die, wherein:
the load signal is in the first voltage range when the total pull-up strength exceeds the local pull-down strengths of all dice combined, and the load signal is in the second voltage range when the total pull-up strength is less than the local pull-down strengths of all dice combined; and
after the amount of power has been requested by a local die for a scheduled operation, the local die either proceeds or does not proceed with the scheduled operation depending on which of the first and second voltage ranges the load signal is in.
2. The memory device as in claim 1, wherein:
said set of one or more pull-up drivers includes one local pull-up driver distributed at each dice.
3. The memory device as in claim 1, wherein:
said set of one or more pull-up drivers includes at least one pull-up driver for the pluralities of dice.
4. The memory device as in claim 1, wherein:
said set of one or more pull-up drivers are deactivated except when on demand to operate in a transitory manner to save power.
5. The memory device as in claim 1, wherein:
one of said set of one or more pull-up driver is a current source approximated by resistors.
6. The memory device as in claim 1, wherein:
said pull-down driver is a current sink approximated by resistors.
7. The memory device as in claim 1, wherein:
when the load signal is in the second voltage range, indicating that the predetermined power capacity has been exceeded after two local dice are simultaneously requesting power, the two local dice repeat the request at different times.
8. The memory device as in claim 1, further comprising:
a component of the memory device that makes a request for power;
a pull-down driver for said component connected to said load signal bus to assert a local pull down on the load signal bus with a local pull-down strength proportional to an amount of power being requested by the component.
9. The memory device as in claim 8, further comprising:
a controller;
wherein the amount of power being requested by the component is estimated by the controller.
10. The memory device as in claim 1, wherein the array of memory cells is of the NAND type.
11. A method of operating a memory device having a plurality of dice powered via a power bus, the power bus supplying power for the memory device having a predetermined power capacity, and each die having an array of memory cells, said method comprising:

provide a load signal bus connecting to said plurality of dice and carrying a load signal at one of first and second voltage ranges to indicate whether or not the predetermined power capacity has been exhausted by operations among said plurality of dice;

pulling up said load signal bus with a pull-up strength proportional to the predetermined power capacity;

pulling down said load signal bus by each die to assert a local pull-down strength proportional to an amount of power being requested by the respective die, wherein:

the load signal is in the first voltage range when the total pull-up strength exceeds the local pull-down strengths of all dice combined, and the load signal is in the second voltage range when the total pull-up strength is less than the local pull-down strengths of all dice combined; and after the amount of power has been requested by a local die for a scheduled operation, the local die either proceeds or does not proceed with the scheduled operation depending on which of the first and second voltage ranges the load signal is in.

12. The method as in claim 11, wherein pulling up said load signal bus comprises using a set of one or more pull-up drivers that include one local pull-up driver distributed at each dice.

13. The method as in claim 11, wherein pulling up said load signal bus comprises using a set of one or more pull-up drivers that includes at least one pull-up driver for the pluralities of dice.

14. The method as in claim 11, further comprising:
deactivating a set of one or more pull-up drivers associated with the load signal bus except when on demand to operate in a transitory manner to save power.

15. The method as in claim 14, wherein:
one of the set of one or more pull-up drivers is a current source approximated by resistors.

16. The method as in claim 11, wherein pulling down said load signal bus is done via a a pull-down driver that is a current sink approximated by resistors.

17. The method as in claim 11, wherein:
when the load signal is in the second voltage range, indicating that the predetermined power capacity has been exceeded after two local dice are simultaneously requesting power, the two local dice repeat the requesting at different times.

18. The method as in claim 11, further comprising:
responding to a component of the memory device making a request for power; and
providing a pull-down driver for said component connected to said load signal bus to assert a local pull-down on the load signal bus with a local pull-down strength proportional to an amount of power being requested by the component.

19. The method as in claim 18, further comprising:
providing a controller;
wherein the amount of power being requested by the component is estimated by the controller.

20. A memory device, comprising:
a plurality of dice powered via a power bus, the power bus supplying power for the memory device having a predetermined power capacity, each die having an array of memory cells;
a load signal bus connecting to said plurality of dice and being in a pull-up state or a pull-down state depending on whether or not the predetermined power capacity has been exhausted by operations among said plurality of dice;
said load signal bus having a set of one or more pull-up drivers with a total pull-up strength proportional to the predetermined power capacity; and
a pull-down driver in each die connected to said load signal bus to assert a local pull-down on the load signal bus with a local pull-down strength proportional to an amount of power being requested by the respective die, wherein:
the load signal bus is in the pull-up state when the total pull-up strength exceeds the local pull-down strengths of all dice combined, and the load signal is in the pull-down state when the total pull-up strength is less than the local pull-down strengths of all dice combined; and
after the amount of power has been requested by a local die for a scheduled operation the local die either proceeds or does not proceed with the scheduled operation depending on whether the load signal bus is in the pull-up state or pull-down state.

\* \* \* \* \*